United States Patent [19]

Satou

[11] 4,146,849
[45] Mar. 27, 1979

[54] VOLTAGE CONTROLLED OSCILLATOR

[75] Inventor: Kouichirou Satou, Kawasaki, Japan

[73] Assignee: Tokyo Shibaura Electric Co., Ltd., Tokyo, Japan

[21] Appl. No.: 850,626

[22] Filed: Nov. 11, 1977

[30] Foreign Application Priority Data

Jan. 31, 1977 [JP] Japan .................. 52/9311[U]

[51] Int. Cl.² .................................. H03K 3/282
[52] U.S. Cl. ...................... 331/111; 331/108 D
[58] Field of Search ............. 331/108 C, 108 D, 111; 307/279

[56] References Cited

U.S. PATENT DOCUMENTS

| | | | |
|---|---|---|---|
| 3,878,482 | 4/1975 | Schowe, Jr. | 331/111 |
| 3,904,988 | 9/1975 | Hsiao | 331/108 C |
| 4,072,910 | 2/1978 | Dingwall | 331/108 D |

Primary Examiner—John Kominski
Attorney, Agent, or Firm—Finnegan, Henderson, Farabow & Garrett

[57] ABSTRACT

A voltage controlled oscillator includes three stages of CMOS inverters arranged in cascade connection. The output of the final stage inverter is connected to the input of the first stage inverter. A capacitor is connected between the input and output of any one of the inverters. The inverter with the capacitor connected thereto comprises two MOS FETs of opposite channel types and is connected in series between high and low voltage sources by control MOS FETs of the same channel types as the respective MOS FETs of the inverter. The gates of the control MOS FETs are connected to control terminals to govern the frequency of the oscillator and one additional fine tune MOS FET is connected across each of control MOS FETs to provide fine tuning of the oscillator.

6 Claims, 9 Drawing Figures

VOLTAGE CONTROLLED OSCILLATOR

BACKGROUND OF THE INVENTION

The invention relates to a voltage controlled oscillator used in a phase locked loop or the like.

Recently, the phase locked loop (PLL) has been widely used, although it is complex in construction. This tendency is due largely to recent remarkable development of integrated circuit technology. The PLL mainly comprises a programmable counter, a reference frequency divider, a phase comparator, a voltage controlled oscillator (VCO) and the like. These circuit components except the VCO are constructed by large-scale integrating complementary metal oxide semiconductor field effect transistors (CMOS FET's) on a single semiconductor chip. Many kinds of such type circuit components have been developed and are commercially available. VCO's in PLL's typically comprise an LC oscillator using a variable capacitance diode and an emitter follower multivibrator. However, such VCO's are difficult to fabricate using LSI technology, although a few VCO's using LSI of CMOS FET's have been developed. The VCO's of such a type are operable in a frequency range up to at most 2 MHz. This restricts their applications to within a narrow scope.

One form of CMOS LSI constructed oscillators of frequency fixed type as shown in FIG. 1 has been proposed of which some elaboration will be given below. Reference numerals 12, 14 and 16 are inverters of CMOS construction being connected in cascade fashion. A resistor 18 is connected between the output side of the inverter 16 and the input side of the inverter 12. The resistor 18 provides a path of positive feedback from the output of the inverter 16 to the input thereof. Between the input of the inverter 16 and the output of the inverter 14, a capacitor 20 is coupled. The product of the capacitance $C_1$ of capacitor 20 and the resistance $R_1$ of the resistor 18 gives the time constant of the circuit. The oscillating period T of the oscillator circuit is given:

$$T = -R_1 C_1 \{\ln \frac{V_{TH}}{V_{DD} + V_{TH}} + \ln \frac{V_{DD} - V_{TH}}{2V_{DD} - V_{TH}} \} \quad (1)$$

where $V_{DD}$ is a power source voltage, and $V_{TH}$ is a threshold voltage of the inverter 16.

FIGS. 2A, 2B and 2C show signal waveforms at the portions (a), (b) and (c) in the FIG. 1 oscillator, respectively.

From the equation (1), it will be seen that the period T may be changed by changing the resistance $R_1$ while fixing the capacitance $C_1$.

This fact leads to the invention.

SUMMARY OF THE INVENTION

The principal object of the invention is to provide a VCO permitting CMOS LSI construction thereof and a high frequency operation.

According to the invention, there is provided a voltage controlled oscillator comprising: a first voltage source terminal connected to a voltage source for supplying a high voltage; a second voltage source terminal connected to a voltage source for supplying a low voltage; an odd number of CMOS inverters of three or more being connected in cascade fashion, the output terminal of the final stage inverter being connected to the input terminal of the first stage inverter, each inverter comprising a first MOS FET of first channel type coupled with the first voltage source terminal and a second MOS FET of second channel type coupled with the second voltage source terminal; a capacitive element inserted between the input and output terminals of any one of the inverters; a third MOS FET being connected in series between one of the first and second MOS FET's of the inverter to which said capacitive element is connected, and being of the same channel type as of the one MOS FET, and its voltage source; and a first control terminal being connected to the gate of the third MOS FET.

Other objects and features of the invention will be apparent from the following description, in conjunction with the accompanying drawings, in which:

DETAILED DESCRIPTION OF THE PREFERRED EMBODIMENTS

Figure 1:
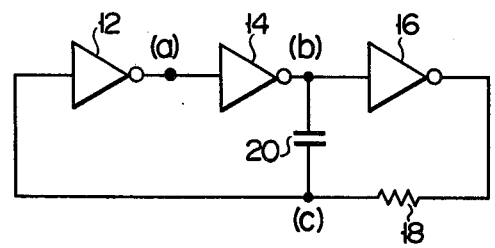
FIG. 1 shows a circuit diagram of a conventional CMOS oscillator of frequency fixed type.
Figure 2A:
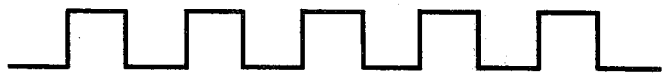
FIG. 2 is a set of waveforms for illustrating the operation of the FIG. 1 circuit.
Figure 2B:
Figure 2C:
Figure 3:
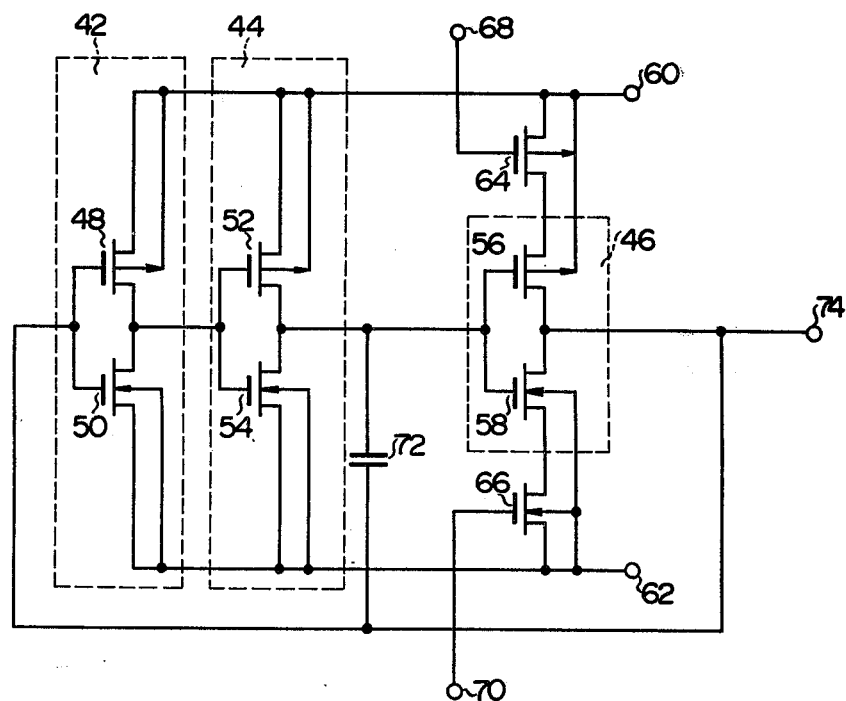
FIG. 3 is a circuit diagram of an embodiment of a voltage controlled oscillator according to the invention.

Referring now to FIG. 3, there is shown an embodiment of a voltage controlled oscillator according to the invention. In the figure, three known CMOS inverters 42, 44, 46 are connected in cascade. The output of the inverter 46 is connected to the input of the inverter 42. The inverter 42 is comprised of a couple of complementary channel type MOS FET's, such as a P-channel FET 48 and an N-channel FET 50. Similarly, the inverter 44 is comprised of a P-channel FET 52 and an N-channel FET 54; the inverter 46 comprises a P-channel FET 56 and an N-channel FET 58. In each inverter, two FET's are commonly connected at drain electrodes and gate electrodes. The source electrodes of the FET's 48, 52 and 56 are commonly connected to a first voltage source terminal 60 leading to a high voltage source $V_{DD}$. To the contrary, the source electrodes of the FET's 50, 54, 58 are commonly connected to a low voltage source $V_{SS}$, through a second voltage source terminal 62. A P-channel MOS FET 64 is connected between the FET 56 of the inverter 46 and the first voltage source terminal 60. That is, the MOS FET 64 is connected at the drain electrode to the source electrode of the FET 56 and at the source electrode to the first voltage source terminal 60. Similarly, an N-channel MOS FET 66 is connected at the drain electrode to the source electrode of the FET 58 and at the source electrode to the second voltage source terminal 62. The gate electrode of the MOS FET 64 is connected to a first control terminal 68. The gate electrode of the MOS FET 66 is connected to a second control terminal 70. A capacitor 72 is inserted between the input and output of the inverter 46. An output terminal 74 of the oscillator is connected to the commonly connected drains of the final stage inverter 46.

As described above, the circuit has three inverters 42, 44 and 46 cascade connected, a capacitor 72 between the input and output of the inverter 46 and a positive feedback circuit from the output of the inverter 46 to the input of the inverter 42. For this reason, it operates as an oscillator. The output of the oscillator is taken out from the output terminal 74. When the output signal of the inverter 46 is high in level, it is expressed in terms of the series connected resistances of the FET's 56 and 64. To the contrary, when it is low, it is expressed in terms of the series connected resistances of the FET's 58 and 66. The resistance of the FET 64 may be changed by controlling the gate potential applied to the first control terminal 68. The resistance of the FET 66 is controllable by gate potential impressed onto the second control terminal 70. The oscillating frequency depends on the time constant which is the product of the output resistance of the inverter 46 and the capacitance of the capacitor 72. Therefore, the oscillating frequency may be changed by controlling the gate voltage potential applied to FET's 64 and 66. Thus, the FIG. 3 circuit is operable as a voltage controlled oscillator. The resistance of the MOS FET may be widely changed, e.g. from several hundreds ohms to several hundreds megaohms.

In this manner, the output resistance of the inverter 46 may be externally controlled. Further, its widely changeable output resistance enables the oscillator to oscillate in a wide range of frequencies from low to high.

Figure 4:
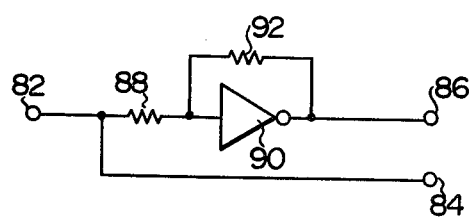
FIG. 4 is a circuit to be used with the FIG. 3 circuit.

In order to attain about 50% duty factor of the oscillating signal waveform, it is desirable that the output resistance of the inverter 46 when its output signal is in high level be equal to that when it is low. This needs the following relation.

$$V_{DD} - V_{C_1} = V_{C_2} - V_{SS} \qquad (2)$$

where $V_{C_1}$ is a control voltage applied to the FET 64 and $V_{C_2}$ is that to the FET 66. Insertion of the circuit as shown in FIG. 4 between the first and second control terminals 68 and 70 would satisfy the equation (2). As shown, the circuit comprises an input resistor 88, a feedback resistor 92 and an inverter or amplifier 90. The input resistor 88 is connected at one end to a terminal 82, and at the other end to the input of the inverter 90 and also to one end of the resistor 92. The resistor 92 is connected across the inverter 90 of which the output is connected to a terminal 86. A terminal 84 is connected to the one end of the input resistor 88. The terminal 82 is coupled to the control voltage source; the terminal 84 to the second control terminal 70; the terminal 86 to the first control terminal 68.

The control voltage $V_C$ is directly applied as $V_{C_2}$ to the second control terminal 70. The inverted $V_C$ likewise is applied as $V_{C_1}$ to the first control terminal.

As a result, there can be obtained an oscillating signal waveform of about 50% duty factor.

An alternate connection is allowed in which the terminal 84 is connected to the first control terminal 68 and the terminal 86 to the second control terminal 70. In this case, the oscillating frequency increases as the gate potential $V_C$ increases. To the contrary, in the previous case, the oscillating frequency decreases as the gate potential $V_C$ increases.

If the 50% duty factor is not desired, any one of the FET's 64 and 66 may be used. In such a case, the oscillating frequency may be controlled through external control of the gate potential.

Figure 5:
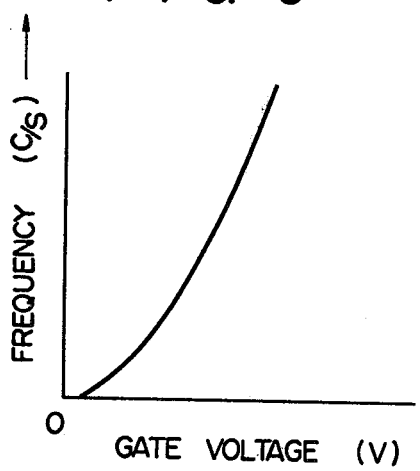
FIG. 5 is a graph illustrating the relationship of frequency versus gate voltage of the FIG. 3 circuit.

Turning now to FIG. 5, there is illustrated the relationship of the oscillation frequency vs. gate voltage of the FIG. 3 oscillator. As seen from the graph, the rate of change of the frequency with respect to the gate voltage is very large. This means that fine adjustment of the oscillation frequency in the FIG. 3 circuit is difficult. The FIG. 5 curve further shows that the oscillation stops in the vicinity of 0V of the control voltage.

Figure 6:
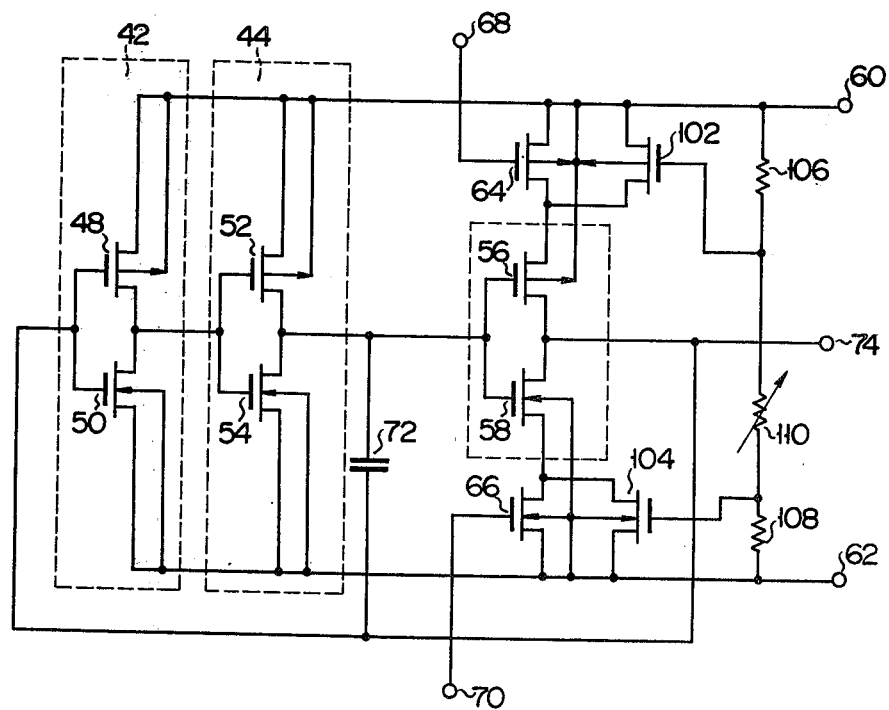
FIG. 6 shows a circuit diagram of another embodiment of the invention.

Another oscillator shown in FIG. 6 is proposed to eliminate such the defects. In FIG. 6, like reference numerals designate like portions in FIG. 3, with omission of elaborated explanation thereof. In the figure, a P-channel MOS FET 102 is connected across the P-channel MOS FET 64. The MOS FET 64 is connected at the drain electrode to the same of the FET 102 and at the source electrode to the same of the FET 102. Similarly, an N-channel FET 104 is connected in parallel with the N-channel FET 66, both transistors being connected to each other at the drain electrodes and the source electrodes, as shown. A resistor 106 is inserted between the gate electrode of the FET 102 and the first voltage source terminal 60. A resistor 108 is connected between the second voltage source terminal 62 and the gate of the FET 104. A variable resistor 110 is further connected between the gates of the FET's 102 and 104.

Resistors 106, 108 and 110 serve to voltage-divide the voltage $V_{DD}$ applied to the first voltage source terminal 60. Therefore, the voltages defined by the resistances of these resistor 106, 108 and 110 are applied between the source and gate of each FET 102 and 104. That is, the voltage appearing across the resistor 106 is applied between the source and gate of the FET 102. The voltage across the resistor 108 is impressed between the source and gate of the FET 104. The voltage dividing ratio may be changed by changing the resistance of the variable resistor 110. In other words, adjustment of the variable resistor 110 changes voltage drops across the resistors 106 and 108, and thus changed the oscillation frequencies.

Figure 7:
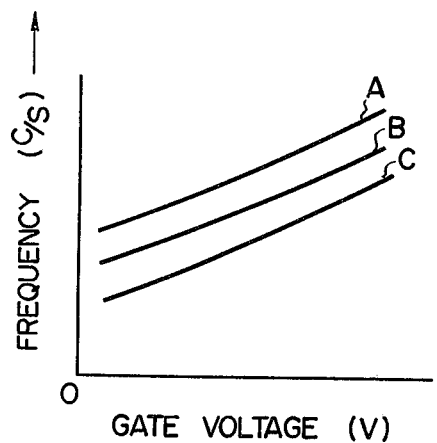
FIG. 7 shows a graph illustrating the relationship between frequency and gate voltage of the FIG. 6 circuit.

FIG. 7 shows a graph illustrating the frequency control voltage relationship of the FIG. 6 oscillator with parameter of the resistance of the variable resistor 110. As shown, a curve A is plotted for small value of the resistor 110. The curves B and C are for larger values of the resistor. That is, the frequency decreases with increase of the resistor 110.

FIG. 7 implies that, in this embodiment, the oscillation frequency may be changed by changing the resistance of the variable resistor while fixing the gate voltage. Accordingly, this example is useful for such a case requiring fixing of the gate voltage. The inclination of each curve A, B and C may be adjusted by the area ratios of FET 64 to FET 102 and of FET 66 to FET 104. In other words, the rate of change of frequency to the gate voltage may be made small, thereby enabling the fine adjustment of the oscillation frequency, through a proper adjustment of the area ratios.

Further, in this embodiment, the oscillation does not stop even if the control voltage is zero, since the FET's 102 and 104 have each a certain amount of resistance.

As described above, the FIG. 6 oscillator has many useful advantages: (1) The center of the frequencies may be adjusted; (2) The rate of change of the oscillating frequency with respect to the gate voltage may also be adjusted; (3) The oscillation does not stop even when the control voltage becomes zero.

Like the previous embodiment, insertion of the FIG. 4 circuit between the first and second control terminals improves the duty factor of the waveform up to about 50%.

The embodiments thus far described have each three stages of the inverters; however, an odd number of the inverter stages is allowed in cascade connection.

What is claimed is:

1. A voltage controlled oscillator comprising:
   a first voltage source terminal connected to a voltage source supplying a high voltage;
   a second voltage source terminal connected to a voltage supplying a low voltage;
   an odd number of CMOS inverters of three or more being connected in cascade fashion, the output terminal of the final stage inverter being connected to the input terminal of the first stage inverter, each inverter comprising a first MOS FET of first channel type connected to said first voltage source terminal and a second MOS FET of second channel type connected to said second voltage source terminal;
   a capacitive element inserted between the input and output terminals of any one of said inverters;
   a third MOS FET of the first channel type connected in series between the first voltage source terminal and the first MOS FET of the inverter to which said capacitive element is connected;
   a fourth MOS FET of the second channel type connected in series between the second voltage source terminal and the second MOS FET of the inverter to which said capacitive element is connected;
   a first control terminal connected to the gate of the third MOS FET to receive a first control voltage signal;
   a second control terminal connected to the gate of the fourth MOS FET to receive a second control voltage signal which is phase-inverted with respect to the first control voltage signal, said first and second control voltage signals controlling the frequency of operation of said oscillator; and
   means for fine tuning said frequency of operation of said oscillator comprising:
   (a) a fifth MOS FET of said first channel type of which the source and drain electrodes are connected to the source and drain electrodes of said third MOS FET, respectively;
   (b) a sixth MoS FET of said second channel type of which the source and drain electrodes are connected to the source and drain electrodes of said fourth MOS FET, respectively; and
   (c) gate voltage control means for controlling gate voltage applied to the gates of the fifth and sixth MOS FETs to thereby fine tune said frequency of operation of said oscillator.

2. A voltage controlled oscillator according to claim 1, wherein said first, third and fifth MOS FETs are of P-channel type, and said second, fourth and sixth MOS FETs are of N-channel type.

3. A voltage controlled oscillator according to claim 1, wherein said first, third and fifth MOS FETs are of N-channel type, and said second, fourth and sixth MOS FETs are of P-channel type.

4. A voltage controlled oscillator according to claim 1, wherein said second control voltage signal is produced by an inverter circuit having a gain of one for inverting the phase of said first control voltage signal.

5. A voltage controlled oscillator according to claim 4, wherein said inverter circuit comprises an input resistor, an amplifier for inverting the phase of the first control voltage signal, and a feedback resistor for feeding an output signal thereof back to the input side of said amplifier, said input resistor having substantially the same resistance as of said feedback resistor.

6. A voltage controlled oscillator according to claim 1, wherein said gate volage control means comprises a first resistor provided between said first voltage source terminal and the gate electrode of said fifth MOS FET, a second resistor provided between said second voltage source terminal and the gate electrode of said sixth MOS FET, and a variable resistor provided between the gate of said fifth MOS FET and the gate of said sixth MOS FET.

* * * * *